(12) United States Patent
Hamburgen

(10) Patent No.: US 8,310,205 B1
(45) Date of Patent: Nov. 13, 2012

(54) MANAGED BATTERY CHARGING

(75) Inventor: William Hamburgen, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/271,225

(22) Filed: Oct. 11, 2011

Related U.S. Application Data

(60) Provisional application No. 61/454,774, filed on Mar. 21, 2011.

(51) Int. Cl.
*H02J 7/00* (2006.01)
*G01N 27/416* (2006.01)

(52) U.S. Cl. ........ 320/130; 320/107; 320/132; 320/133; 320/164; 324/426

(58) Field of Classification Search ............. 320/130
See application file for complete search history.

(56) References Cited

U.S. PATENT DOCUMENTS

| | | | |
|---|---|---|---|
| 5,754,029 A | 5/1998 | Mann | |
| 5,955,869 A * | 9/1999 | Rathmann | 320/132 |
| 6,563,318 B2 * | 5/2003 | Kawakami et al. | 324/426 |
| 7,095,211 B2 * | 8/2006 | Denning | 320/132 |
| 7,570,015 B2 | 8/2009 | Bansal | |
| 2010/0123436 A1 | 5/2010 | Herrod | |
| 2011/0083025 A1 | 4/2011 | Lee | |
| 2011/0202221 A1 | 8/2011 | Sobue | |

OTHER PUBLICATIONS

Non-Final Office Action for U.S. Appl. No. 13/271,220, mailed Jan. 4, 2012, 8 pages.
Final Office Action for U.S. Appl. No. 13/271,220, mailed Aug. 28, 2012, 12 pages.

* cited by examiner

*Primary Examiner* — Yalkew Fantu
(74) *Attorney, Agent, or Firm* — Brake Hughes Bellermann LLP

(57) ABSTRACT

A method includes charging a battery to a first percentage of full capacity, where the first percentage of full capacity is above a pre-charge capacity and below the full capacity, monitoring, using a controller, the battery for a predetermined threshold and in response to the battery reaching the predetermined threshold, charging the battery to a second percentage of full capacity, where the second percentage of full capacity is greater than the first percentage of full capacity.

18 Claims, 7 Drawing Sheets

MANAGED BATTERY CHARGING

CROSS REFERENCE TO RELATED APPLICATION

This application claims the benefit of U.S. Provisional Patent Application No. 61/454,774, filed on Mar. 21, 2011, entitled "Managed Battery Charging," which is hereby incorporated by reference in its entirety.

TECHNICAL FIELD

This description relates to managed battery charging.

BACKGROUND

Many devices such as, for example, cell phones, smart phones, laptop computing devices, and other types of mobile computing devices use one or more batteries to provide power to the device. In these devices, many of the batteries may be rechargeable batteries such as, for example, lithium-ion (Li-ion) batteries. The rechargeable batteries may include one or more battery cells. To recharge the batteries, the device may be plugged into a power source such as, for example, AC mains, a car battery through a charging port in a car, or other power sources. When the device is connected to the power source, the batteries are typically charged to their full capacity. Always charging the rechargeable batteries to their full capacity may cause the battery cells to experience a significant reduction of cell capacity and a shortened service life over time. As a result of the reduced capacity, the runtime of the devices that use these batteries becomes shorter and shorter.

Additionally, constantly charging the batteries to the full capacity, such as leaving the device and batteries connected to a power source, also may cause the battery cells to experience a significant reduction of cell capacity and a shortened service life over time. Many laptop users who leave the laptop and associated battery constantly plugged into AC mains experience a significant reduction in the runtime of the laptop after a short period of time, as well as a short life span for the batteries.

Additionally, deep cycling the batteries from a full capacity charge to a full discharge also may cause the battery cells to experience a significant reduction of cell capacity and a shortened service life over time.

Finally, the batteries for a device may not always need to be maintained at full capacity. For example, when a power source is readily accessible the device may not need to be fully charged. The batteries for a device may only need to be fully charged when a power source is not readily available.

SUMMARY

According to one general aspect, a method includes charging a battery to a first percentage of full capacity, where the first percentage of full capacity is above a pre-charge capacity and below the full capacity, monitoring, using a controller, the battery for a predetermined threshold and in response to the battery reaching the predetermined threshold, charging the battery to a second percentage of full capacity, where the second percentage of full capacity is greater than the first percentage of full capacity.

Implementations may include one or more of the following features. For example, the battery may be a lithium ion battery. Charging the battery to the first percentage of full capacity and charging the battery to the second percentage of full capacity may occur during different charging cycles. The predetermined threshold may include a number of charge cycles. The predetermined threshold may include a load history metric. The predetermined threshold may include a period of time. The predetermined threshold may include a temperature history. The predetermined threshold may include a combination of two or more criteria selected from the group consisting of a number of charge cycles, a load history metric, a period of time and a temperature history. The second percentage of full capacity may be substantially equal to the full capacity of the battery. The battery may be charged to an intermediate percentage of full capacity, where the intermediate percentage of full capacity is between the first percentage of full capacity and the second percentage of full capacity.

In another general aspect, an apparatus includes a charging circuit that is configured to charge a battery and a controller that is operably coupled to the charging circuit. The controller is configured to charge the battery to a first percentage of full capacity, where the first percentage of full capacity is above a pre-charge capacity and below the full capacity, monitor the battery to determine when a predetermined threshold is reached and in response to the battery reaching a predetermined threshold, charge the battery to a second percentage of full capacity, where the second percentage of full capacity is greater than the first percentage of full capacity.

Implementations may include one or more of the following. For example, the battery may include a lithium ion battery. The controller may be configured to charge the battery to the first percentage of full capacity and charge the battery to the second percentage of full capacity during different charging cycles. The predetermined threshold may include a number of charge cycles. The predetermined threshold may include a load history metric. The predetermined threshold may include a period of time. The predetermined threshold may include a temperature history. The predetermined threshold may include a combination of two or more criteria selected from the group consisting of a number of charge cycles, a load history metric, a period of time and a temperature history. The second percentage of full capacity may be substantially equal to the full capacity of the battery. The controller may be configured to charge the battery to an intermediate percentage of full capacity, where the intermediate percentage of full capacity is between the first percentage of full capacity and the second percentage of full capacity.

In another general aspect, a method includes charging a battery to a first percentage of full capacity, where the first percentage of full capacity is above a pre-charge capacity and below the full capacity, measuring, using a controller, a capacity of the battery and charging the battery to a second percentage of full capacity based on the measured capacity of the battery, where the second percentage of full capacity is greater than the first percentage of full capacity.

Implementations may include one or more of the following features. For example, the battery may include a lithium ion battery. Charging the battery to the first percentage of full capacity and charging the battery to the second percentage of full capacity may occur during different charging cycles. The method may include monitoring, using the controller, the battery for a predetermined threshold, where charging the battery to the second percentage of full capacity may include charging the battery to the second percentage of full capacity based on a combination of the measured capacity of the battery and the battery reaching the predetermined threshold. The second percentage of full capacity may be substantially equal to the full capacity of the battery.

In another general aspect, an apparatus includes a charging circuit that is configured to charge a battery and a controller that is operably coupled to the charging circuit. The controller is configured to charge the battery to a first percentage of full capacity, where the first percentage of full capacity is above a pre-charge capacity and below a full capacity, measure a capacity of the battery and charge the battery to a second percentage of full capacity based on the measured capacity of the battery, where the second percentage of full capacity is greater than the first percentage of full capacity.

Implementations may include one or more of the following features. For example, the battery may include a lithium ion battery. The controller may be configured to charge the battery to the first percentage of full capacity and charge the battery to the second percentage of full capacity during different charging cycles. The controller may be configured to monitor the battery for a predetermined threshold and charge the battery to the second percentage of full capacity based on a combination of the measured capacity of the battery and the battery reaching the predetermined threshold. The second percentage of full capacity may be substantially equal to the full capacity of the battery.

The details of one or more implementations are set forth in the accompanying drawings and the description below. Other features will be apparent from the description and drawings, and from the claims.

DETAILED DESCRIPTION

Figure 1:
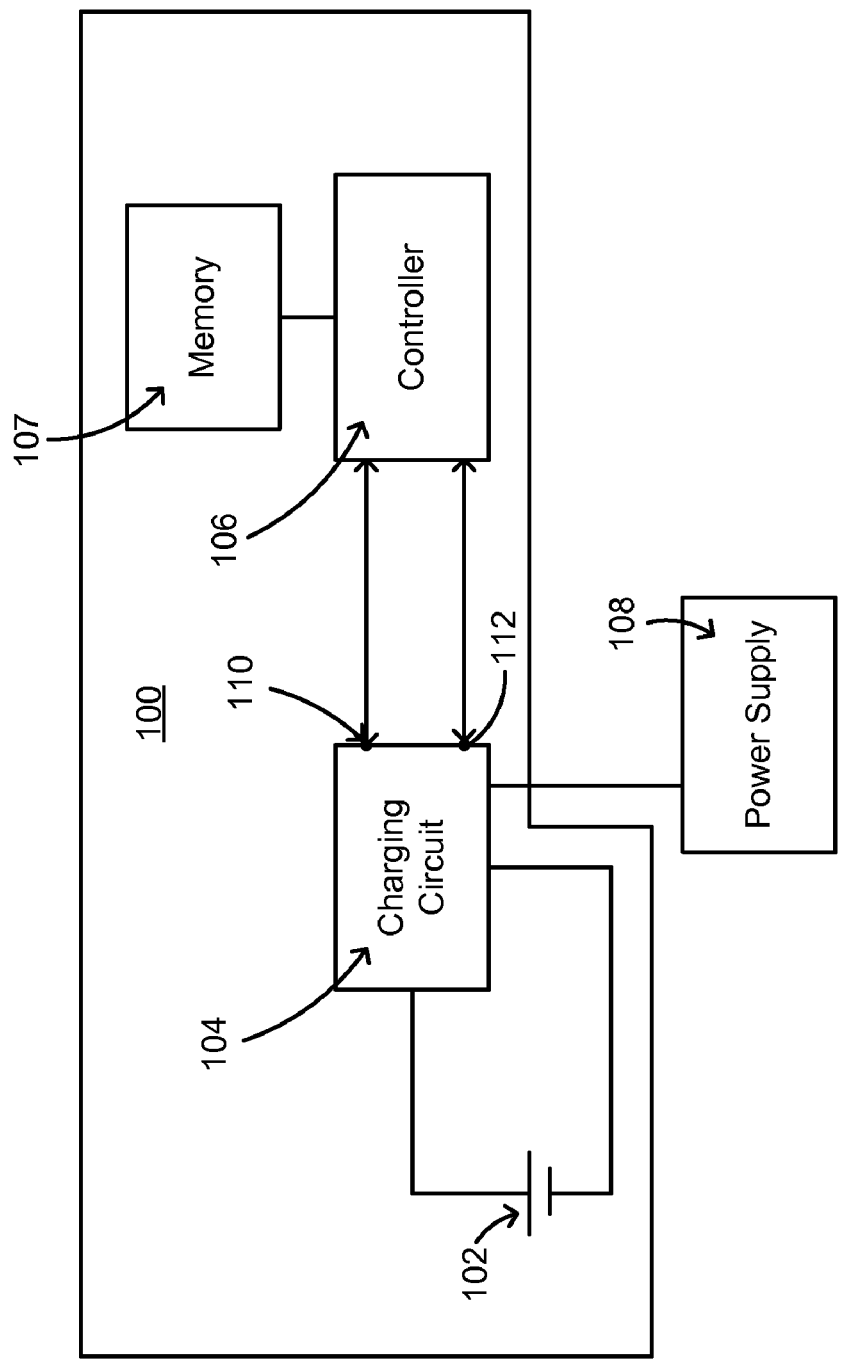
FIG. 1 is an exemplary block diagram of a system for charging a battery.

This document describes systems and techniques for managed battery charging. Throughout this document, a battery or cell is referred to as being charged to a percentage of full capacity, where capacity or full capacity means that the battery or cell is fully charged. Full capacity or current full capacity may be used to mean a battery's capacity at that given instance in the life of the battery given safety policies and battery wear. A percentage of full capacity means that the battery is charged to less than full capacity. The capacity of a battery is the total amount of electrical charge a battery is able to hold, where the capacity is usually expressed in ampere-hours (or milli ampere-hours) or as watt-hours. The percentage of capacity also may be used interchangeably with state of charge (SOC), where the SOC for a rechargeable battery is the fraction, usually expressed as a percentage, of the total electrical energy stored in a battery by charging that is still available for discharging at a certain point in time.

The SOC of a battery may be calculated using one or more techniques including voltage translation, coulomb counting, measuring actual capacity by integrating its current from completely full to completely empty (or vice-versa), other techniques or combinations of these techniques.

Also, throughout this document, a battery may be referred to as being charged above a pre-charge capacity. The pre-charge capacity may be used to refer to a pre-charging process of the battery, which is at a bottom level of a battery's capacity used to avoid cell damage from rapid charging.

In one exemplary implementation, the percentage of full capacity that the battery is charged is varied over the life of the battery based on a predetermined threshold. For example, the battery may be charged to a percentage of full capacity above the pre-charge capacity and below the full capacity each time that the battery is charged. After a predetermined threshold is met, for example, after a predetermined number of charging cycles or after a predetermined period of time, the battery is charged to a higher percentage of full capacity than the initial percentage of full capacity. This higher percentage of full capacity also may be below the full capacity. The process may repeat until the battery is eventually charged to full capacity during regular charging. Thus, there may be multiple intermediate percentage levels of full capacity that the battery is charged to, where is successive percentage of full capacity is higher than that previous percentage of full capacity that the battery is charged to.

While charging the battery to a percentage of full capacity less than full capacity may result in slightly shorter usage times, an overall constant apparent capacity may be achieved. Achieving a constant apparent capacity for the battery may result in an increased service life for the battery and a more constant level of device runtime over the life of the battery. Constant apparent capacity means that to a user of a device, the device may exhibit a more constant runtime over the life of the battery. This may result in users who are more satisfied with the device because there may be no noticeable or a less noticeable reduction in device runtime and battery performance as the device and the battery age. A constant apparent capacity may be one end result in each of these exemplary implementations.

In another exemplary implementation, the percentage of capacity that a battery is charged to is varied over the life of the battery based on a measured capacity of the battery. For example, the battery may be charged to a percentage of full capacity above a pre-charge capacity and below the full capacity each time that the battery is charged. The actual capacity of the battery may be measured and the battery may be charged at to a higher percentage of full capacity than the initial percentage of full capacity based on the measured capacity. This higher percentage of full capacity also may be at a percentage of capacity that is below the full capacity. The process may repeat and the percentage of capacity that the battery may charged to may be ramped up over time until the battery is being charged to full capacity. While charging the battery to a percentage of capacity less than full capacity may result in slightly shorter usage time, an overall constant apparent capacity may be achieved. In this manner, the measured capacity may be used to maintain a substantially constant apparent capacity.

In another exemplary implementation, the percentage of capacity that a battery is charged to is varied over the life of the battery based on a combined predetermined threshold and measured capacity. In this manner, multiple different criteria may be used to maintain a substantially constant apparent capacity over the service life of the battery.

In another exemplary implementation, the battery may be charged to and maintained at a reduced percentage of capacity. In this manner, the capacity of the battery and the service life of the battery may be improved. The battery may be charged to full capacity based upon an event notification and/or an event history.

An event notification may include many different types of events or a combination of events. For example, an event notification may include a user-subscribed event such as a calendar event or an email event. An event notification may include a sensor (e.g., global positioning satellite (GPS) receiver, position-related sensor, temperature sensor, or other sensor) triggered event and other types of event. For example, the battery may be charged to a percentage of full capacity that is less than full capacity. If an airline flight or an offsite meeting is calendared, then the battery may charged be to the full capacity before the flight or before leaving for the meeting. In this manner, the service life and capacity of the battery may be improved because the battery is not always charged to full capacity.

In another exemplary implementation, an event notification may include a notification based on an external event or an unsubscribed event. For example, an event notification based on an external event may include a severe weather warning, a forecast of weather-induced brownout conditions, scheduled rolling blackouts or brownouts, an external news event or other types of external events. In one exemplary implementation, a device may be notified of these external events through an opt-in election where the user of the device opts in to receive external event notifications such as through a calendar application or a service, a weather application or service, or a utility company notification service. In other exemplary implementations, a user may opt-in to an aggregated service that provides personalized charging recommendations, default services, and feeds from services.

In another exemplary implementation, the battery may be charged to and maintained at a reduced percentage of full capacity. The battery may be charged to a higher percentage of full capacity or to full capacity based on either a series of events or an event history. For example, an event history may be used to determine when and in which event situations to charge the battery to a higher percentage of full capacity or to full capacity.

In one exemplary implementation, a user interface may be provided to enable the user to determine settings for managing the battery charge. For example, a user interface may enable the user charge the battery to full capacity independent of any event notifications and/or predetermined thresholds. Also, the user interface may enable the user to reduce percentage of full capacity that the battery is charged to, for example, in order to improve a service life of the battery. Also, the user interface may be configured to provide the user with battery management options that equate to different percentage levels of battery capacity.

Referring to FIG. 1, a system 100 for charging a battery 102 is illustrated. The system 100 may include a charging circuit 104, a controller 106 and a memory 107. The system 100 may be connected to a power supply 108 for providing a power source to charge the battery 102 using the charging circuit 104. The system 100 may be implemented in any type of device that uses a rechargeable battery. The system 100 may be implemented in a device including, for example, a cell phone, a smart phone, a tablet device, a laptop computing device, a mobile computing device, a gaming device, a music device, an automobile, a scooter, a flashlight, an emergency lighting system, or any combinations of these devices or any type of device that uses a rechargeable battery.

The power supply 108, which may be used to charge the battery 102, may include any type of power supply that is used to charge batteries. For example, the power supply 108 may include AC mains through a power cord, a car battery through a power cord or a power supply from another device such as, for example, the power supply from a computer (e.g., a desktop computer or a laptop computer) through a cord such as an USB cable.

The battery 102 may include any type of rechargeable battery containing one or more battery cells. For example, the battery may be a lithium ion (Li-ion) battery containing one or more Li-ion cells. In other implementations, the battery 102 may be a nickel-based battery such as a nickel-cadmium (NiCd) battery or a nickel-metal hydride (NiMH) battery.

In one exemplary implementation, the battery 102 may be a Li-ion battery. A typical Li-ion battery may have a state of charge (SOC) from 100% when floated at 4.2V to 0% when discharged slowly to 2.7V. The SOC may be approximated using the battery voltage. Other techniques, as discussed above, also may be used to measure and/or to approximate the SOC. 4.2V may be considered a full charge or charged to 100% capacity. A range of about 2.7V to 3.0V may be considered a fully discharged battery or represent a 0% capacity.

The charging circuit 104 is operably coupled to the battery 102 and to the controller 106. More specifically, the charging circuit 104 may be connected to the terminals (not shown) of the battery 102. The charging circuit 104 may be an analog charging circuit, a digital charging circuit or a combination of an analog charging circuit and a digital charging circuit. When the system 100 is connected to the power supply 108, the charging circuit 104 may be configured regulate the power being provided from the power supply 108 to the battery 102.

The charging circuit 104 may include one or more pins 110 and 112. Communications between the charging circuit 104 and the controller 106 is necessary. The pins 110 and 112 may provide coupling points between the charging circuit 104 and the controller 106. In one exemplary implementation, the pin 110 may provide a coupling point for the charging circuit 104 to exchange information about the state of the battery with the controller 106. For example, the pin 110 may provide a point for the controller 106 to obtain a capacity of the battery 102 from the charging circuit 104. In one exemplary implementation, the pin 112 may provide a point for the controller 106 to provide charging information to the charging circuit 104. For example, the pin 112 may provide a point for the controller 106 to provide a percentage of capacity setpoint to indicate a percentage of capacity that the charging circuit 104 should charge the battery 102. The setpoint may be a variable setpoint. The setpoint may be expressed in other measures as well, including a float voltage setpoint, which may equate to a certain percentage of charge.

The controller 106 is operably coupled to the charging circuit 104. For instance, as described above, the controller 106 may be coupled to the charging circuit 104 through the pins 110 and 112. The controller 106 may include a microcontroller or a processor, where the microcontroller or the processor is configured to execute instructions, which may be stored in a memory 107 to perform various actions, such as those described in this document. In one exemplary implementation, the controller 106 may be implemented as an independent controller. In other exemplary implementations, the controller 106 may be implemented as a part of another controller. In this manner, the controller 106 may be implemented as part of a controller or processor for a device in which system 100 is implemented. For example, the controller 106 may be implemented as part of a processor for a cell phone or as part of a processor (e.g., central processing unit (CPU)) or other controller (e.g., video controller) for a computing device. In other exemplary implementations, the charging circuit 104 and/or the controller 106 may be incorporated as components of the battery 102.

In one exemplary implementation, the controller 106 may be configured to charge the battery 102 to a first percentage of full capacity, where the first percentage of capacity is above a pre-charge capacity and below a full capacity. For example, the controller 106 may send a signal to the charging circuit 104 through the pin 112 to cause the charging circuit 104 to charge the battery 102 to a specific percentage of full capacity. The controller 106 may be configured to select the first percentage of full capacity at a percentage that is determined to improve the service life of the battery 102 and that is determined to maintain a substantially constant apparent capacity over the life of the battery 102.

The controller 106 may be configured to monitor the battery 102 for one or more predetermined thresholds. The controller 106 also may be configured to track when the predetermined thresholds may be reached in conjunction with a memory 107, which may be used to store the predetermined thresholds and to store any tables. The stored tables may be used to assist in tracking when a predetermined threshold has been reached. A predetermined threshold may include, for example, a period of time, a number of charge cycles, a load history metric, a temperature history, or a combination of these different thresholds.

The memory 107 may be any type of non-transitory storage medium that is used to store instructions for execution by the controller 106. The memory 107 may include data and information that is monitored and tracked by the controller 106 as related to the battery 102 including event logs, battery voltage set points and/or battery percentage of capacity set points. The memory 107 also may store information related to other components.

For example, in one implementation, the predetermined threshold may be a period of time. The period of time may include a period of time related to the amount of time the battery 102 has been charged or connected to a power source. Also, the period of time may include a period of time related to the amount of time the battery 102 has been in use such as when the battery 102 is supplying power to a device. The period of time may be implemented in various different measurements including days, hours, minutes, seconds, etc. The predetermined threshold may be set by the controller 106 or by default at a certain period of time, such as 100 hours. When the predetermined period of time of 100 hours is reached, the controller 106 may be configured to change percentage of full capacity that the battery is charged to. For instance, the controller 106 may be configured charge the battery to a percentage of full capacity higher than the first percentage of full capacity, but still below the full capacity.

The predetermined threshold may be reset (or alternatively a second threshold level may be set as part of a continuous count) and when the predetermined threshold is met again (or the new predetermined threshold is met), the controller 106 may be configured to increase the percentage of full capacity again. The new predetermined threshold may be the same period of time, in this example 100 hours, or the predetermined threshold may be set to a different period of time such as, for example, 50 hours. This process may be repeated such that the controller 106 increases the percentage of full capacity over time as predetermined threshold periods of time are reached. In this manner, a constant apparent capacity may be maintained over the life of the battery 102.

In another exemplary implementation, the predetermined threshold may be a number of charge cycles. For example, the predetermined threshold may be set by the controller 106 or by default to a specific number of charging cycles, such as 50 charging cycles. When the predetermined threshold of 50 charging cycles is reached, the controller 106 may be configured to change the percentage of full capacity that the battery is charged to. For instance, the controller 106 may be configured to charge the battery to a percentage of full capacity higher than the first percentage of full capacity, but still below the full capacity.

The predetermined threshold of charging cycles may be reset (or alternatively a second threshold level may be set as part of a continuous count) and when the predetermined threshold is met again (or the new predetermined threshold is met), the controller 106 may be configured to increase the percentage of full capacity that the battery is charged to again. The new predetermined threshold may be the same number of charging cycles, in this example 50 charging cycles, or the predetermined threshold may be set to a different number of charging cycles such as, for example, 25 charging cycles. This process may be repeated such that the controller 106 increases the percentage of capacity that the battery is charged to over time as predetermined threshold numbers of charging cycles are reached. In this manner, a constant apparent capacity may be maintained over the life of the battery 102.

In another exemplary implementation, the predetermined threshold may be a temperature that is related to a temperature history. Over time the battery 102 may increase in temperature during the charging cycle, where the increase in temperature may correspond to a reduction in battery capacity. For example, the predetermined threshold may be set by the controller 106 or by default to a specific temperature based on a temperature history. When the predetermined threshold of the specific temperature is reached, the controller 106 may be configured to change the percentage of full capacity that the battery is charged to. For instance, the controller 106 may be configured to charge the battery to a percentage of full capacity that is higher than the first percentage of full capacity, but still below the full capacity.

The predetermined threshold of temperature may be reset (or alternatively a second threshold level may be set as part of a continuous count) and when the predetermined threshold is met again (or the new predetermined threshold is met), the controller 106 may be configured to increase the percentage of the full capacity that the battery is charged to again. The new predetermined threshold may be the same temperature or the predetermined threshold may be set to a different temperature such as, for example, a higher temperature based on a temperature history. This process may be repeated such that the controller 106 increases the percentage of full capacity that the battery is charged to over time as predetermined thresholds of temperatures are reached. In this manner, a substantially constant apparent capacity may be maintained over the life of the battery 102.

In another exemplary implementation, the predetermined threshold may be related to a load history metric. For example, the load history metric may be a measure of the load on the battery 102 over a period of time. The predetermined threshold may be set by the controller 106 or by default to a value related to the load history of the battery 102. When that value is reached, the controller 106 may be configured to charge the battery to a percentage of full capacity that is higher than the first percentage of full capacity, but still below the full capacity. The percentage of full capacity that the battery 102 is charged to may be increased over time based on the load history. In this manner, a substantially constant apparent capacity may be maintained over the life of the battery 102.

In another exemplary implementation, the predetermined threshold may be a combination of different types of predetermined thresholds. For example, the predetermined threshold may be set by the controller 106 or by default to a specific number of charging cycles, such as 50 charging cycles and to a specific period of time, such as 50 hours. When either of the predetermined thresholds is reached, the controller 106 may be configured to change the percentage of full capacity that the battery is charged to. For instance, the controller 106 may be configured to increase the percentage of full capacity higher than the first percentage of full capacity, but still below the full capacity.

The predetermined threshold of charging cycles and period of time may be reset (or alternatively second threshold levels may be set as part of a continuous count) and when either of the predetermined thresholds is met again (or the new predetermined threshold is met), the controller 106 may be configured to increase the percentage of full capacity that the battery is charged to again. The new predetermined threshold may be the same number of charging cycles and the same period of time or the predetermined threshold may be set to a different number of charging cycles and a different period of time. This process may be repeated such that the controller 106 increases the percentage of full capacity over time as predetermined threshold numbers of charging cycles or periods of time are reached. In this manner, a substantially constant apparent capacity may be maintained over the life of the battery 102.

In one exemplary implementation, if the system 100 is implemented in a cell phone or a smart phone and the battery 102 is a Li-ion battery, the controller 106 may be configured to charge the battery 102 to a percentage of the full capacity such as, for example, 90% of capacity. A predetermined threshold may be set such as, for example, a period of time, a number of charging cycles, a temperature history, a load history metric or a combination of these thresholds, as described above. The controller 106 monitors the battery 102 to determine if the predetermined threshold has been reached. If the predetermined threshold has not been reached, then the controller 106, through the charging circuit 104, continues to charge the battery 102 each time to 90% of full capacity.

Once the controller 106 determines that the battery 102 has met and/or exceeded the predetermined threshold, the controller 106 is configured to change the percentage of full capacity that the battery is charged to a different percentage of full capacity each subsequent time the battery 102 is charged. For example, the second percentage of capacity may be 91%. In this manner, the battery 102 is charged to the first percentage of full capacity, 90%, every time until the predetermined threshold is met. Once the predetermined threshold is met, the battery 102 is charged to the second percentage of full capacity, 91%, every time going forward until a next or reset predetermined threshold is met. This process may repeat by stepping up the percentage of full capacity that the battery is charged to in multiple intermediate steps throughout the life of the battery using the predetermined threshold as a trigger point. At some point in time, the controller 106 may charge the battery 102 to full capacity each time the battery is charged.

In another exemplary implementation, the controller 106 may be configured to measure an actual capacity of the battery 106 and use the measured capacity to change the percentage of full capacity that the battery 102 is charged. For example, if the system 100 is implemented in a cell phone or a smart phone and the battery 102 is a Li-ion battery with a full capacity of 4.20V, the controller 106 may be configured to charge the battery 102 to a first percentage of full capacity of 92%. The battery 102 may be charged to 92% of full capacity each time until it is changed by the controller 106 based on a specific measured capacity. The controller 106 measures the capacity of the battery 102 through the charging circuit 104 and one of the pins 110 and 112. Based on the measured capacity of the battery 102, the controller 106 may charge the battery 102 to a second percentage of full capacity of 93%. In this manner, the percentage of full capacity that the battery 102 is charged to may be increased over time to maintain a constant apparent capacity of the battery 102.

In another exemplary implementation, the controller 106 may be configured to use one or more predetermined thresholds and a measured capacity of the battery 102 to change the percentage of full capacity that the battery 102 is charged to over time to maintain a constant apparent capacity of the battery 102.

Figure 2:
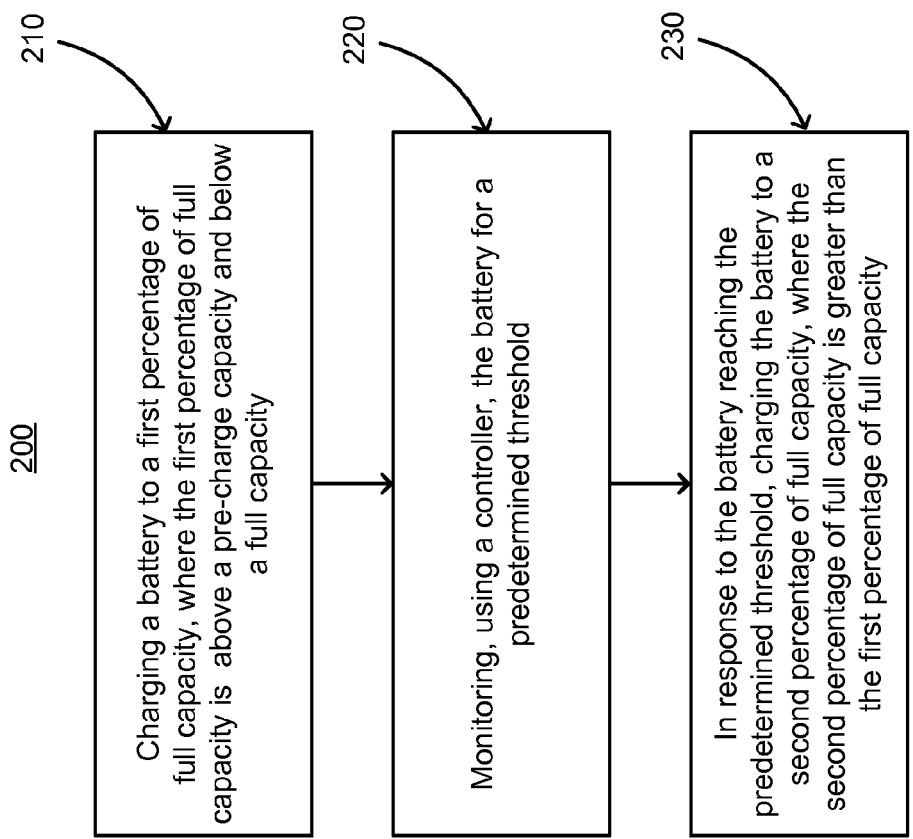
FIG. 2 is flow diagram of an exemplary process for implementing the system of FIG. 1.

Referring to FIG. 2, an exemplary flow diagram illustrates a process 200. Process 200 may include charging the battery to a first percentage of full capacity, where the first percentage of full capacity is above a pre-charge capacity and below a full capacity (210). For example, the controller 106 may be configured to charge the battery 102 to a first percentage of full capacity of 93%. Process 200 also includes monitoring, using a controller, the battery for a predetermined threshold (220). For example, as discussed above, the controller 106 may be configured to monitor the battery 102 for one or more predetermined thresholds, where the predetermined thresholds may include, for instance, a period of time, a number of charging cycles, a load history metric, a temperature history or a combination of different thresholds.

In response to the battery reaching a predetermined threshold, the battery may be charged to a second percentage of full capacity, where the second percentage of full capacity is greater than the first percentage of full capacity (230). For example, when the controller 106 determines that one or more of the predetermined thresholds have been met and/or exceeded, the controller 106 may change the percentage of full capacity that the battery 102 is charged to from 93% to 94%. The controller 106 may then reset the predetermined thresholds and continue monitoring the battery 102 to determine when the next predetermined threshold has been met. When the controller 106 determines that one or more of the predetermined thresholds have been met and/or exceeded, the controller 106 may change the percentage of full capacity that the battery 102 is charged from 94% to 95%. While the battery is charged to a higher and higher percentage of full capacity over time, the actual runtime on a single charge may remain approximately constant. In this manner, the battery 102 may exhibit a constant apparent capacity over the service life of the battery.

Figure 3:
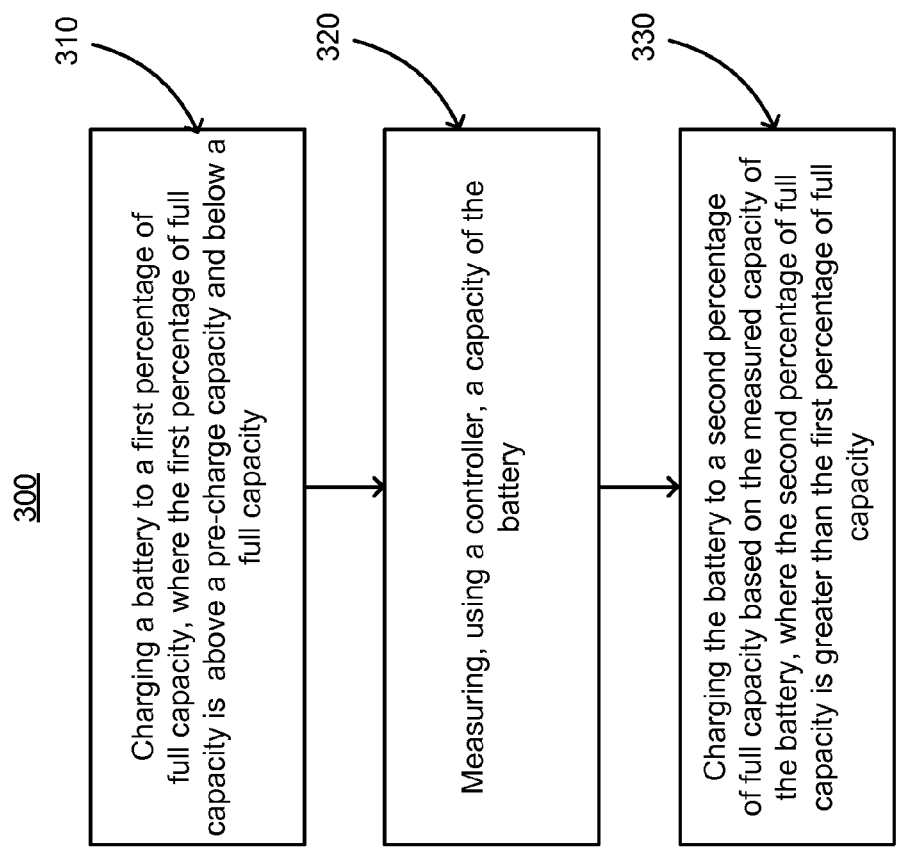
FIG. 3 is a flow diagram of an exemplary process for implementing the system of FIG. 1.

Referring to FIG. 3, an exemplary flow diagram illustrates a process 300. Process 300 may include charging the battery to a first percentage of full capacity, where the first percentage of full capacity is above a pre-charge capacity and below a full capacity (310). For example, the controller 106 may be configured to charge the battery 102 to a first percentage of full capacity of 90%. Process 300 also includes measuring, using a controller, a capacity of the battery (320). For example, as discussed above, the controller 106 may be configured to measure the capacity of the battery 102 using the pin 110 on the charging circuit 104.

Based on the measured capacity of the battery, the battery may be charged to a second percentage of full capacity, where the second percentage of full capacity is greater than the first percentage of full capacity (330). For example, when the controller 106 determines that a specific measured capacity has been reached, the controller 106 may change the percentage of full capacity that the battery 102 is charged from 90% to 92%. The controller 106 may then continue measuring the capacity of the battery 102 to determine when to change the percentage of full capacity again. When the controller 106 determines that a specific measured capacity has reached, the controller 106 may change the percentage of full capacity that the battery 102 is charged from 92% to 94%. In this manner, the battery 102 may exhibit a constant apparent capacity over the service life of the battery.

In another exemplary implementation, a battery may be charged to a percentage of full capacity. In this manner, the constant apparent capacity of the battery and the service life of the battery may be improved. In response to an event notification, the battery may be charged to full capacity. An event notification may include many different types of events or combination of events. For example, an event notification may include a calendar event, an email event, a sensor (e.g., position-related sensor, global positioning satellite (GPS) receiver, temperature sensor, or other sensor) triggered event and other types of events. For example, the battery may be charged to a first percentage of full capacity that is above a pre-charge capacity and that is less than the full capacity. If an airline flight or an offsite meeting is calendared, then the battery may be charged to full capacity before the flight or before leaving for the meeting. In this manner, the service life and constant apparent capacity of the battery may be improved because the battery is not always charged to full capacity. The battery may be charged to full capacity based upon an event notification.

Figure 4:
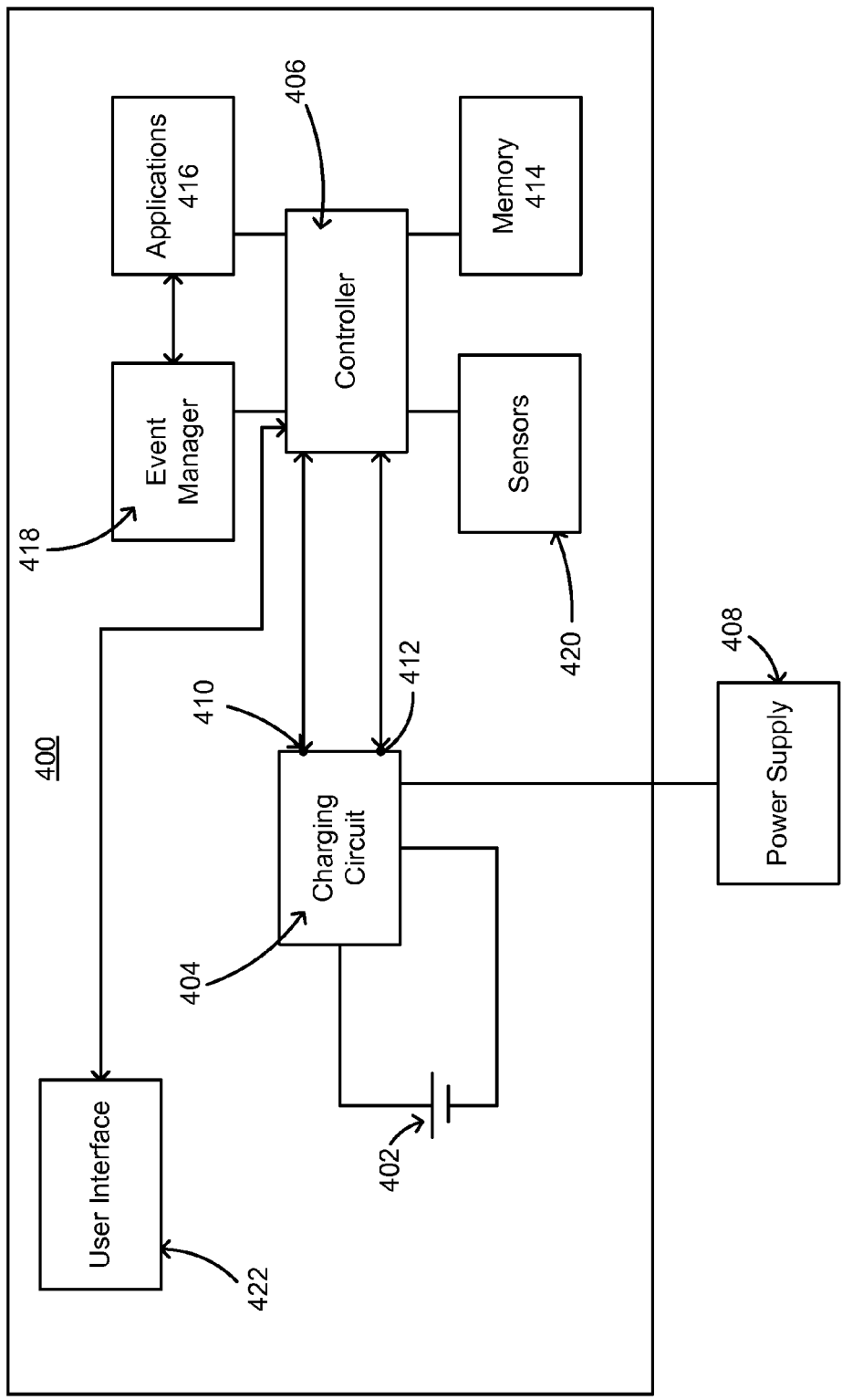
FIG. 4 is an exemplary block diagram of a system for charging a battery.

Referring to FIG. 4, a system 400 for charging a battery 402 is illustrated. The system 400 may include a charging circuit 404, a controller 406, a memory 414, one or more applications 416, an event manager 418, one or more sensors 420 and a user interface 422. The battery 402, the charging circuit 404, the controller 406 and the memory 414 may be the same or similar components as the battery 102, charging circuit 104, the controller 106 and the memory 107 of FIG. 1, as described above. The charging circuit 404, the controller 406, the memory 414, the applications 416, the event manager 418, the sensors 420 and the user interface 422 may be operably coupled to each other through a bus or other communication means.

In some exemplary implementations, one or more of the components, for example, the applications 416 and the event manager 418 may not be a part of the local system 400. Instead, one or more of these components may be located remotely on a remote computing device and accessed by the system 400 over a communications network (e.g., a wired or wireless network). For instance, the system 400 may access instances of the applications 416, for example, through a browser or other user interface for use on the system 400 even though the applications 416 are stored on a remote device.

The system 400 may be connected to a power supply 408 for providing a power source to charge the battery 402 using the charging circuit 404. The system 400 may be implemented in any type of device that uses a rechargeable battery. The system 400 may be implemented in a device including, for example, a cell phone, a smart phone, a tablet device, a laptop computing device, a mobile computing device, a gaming device, a music device, a scooter, an automobile, any combinations of these devices or any type of device that uses a rechargeable battery.

The power supply 408 which may be used to charge the battery 402 may include any type of power supply that is used to charge batteries. For example, the power supply 408 may include AC mains through a power cord, a car battery through a power cord or a power supply from another device, such as, for example the power supply from a computer (e.g., a desktop computer or a laptop computer) through a cord such as an USB cable.

The memory 414 may be any type of non-transitory storage medium that is used to store instructions for execution by the controller 406. The memory 414 may include data and information that is monitored and tracked by the controller 406 as related to the battery 402 including event logs, battery voltage set points and/or battery percentage of capacity set points. The memory 414 also may store information related to the other components including the applications 416, the event manager 418 and the sensors 420 including event history, event logs, etc.

The applications 416 may include one or more different types of applications. As discussed above, the applications 416 may be located locally and/or remotely. For example, the applications 416 may include a local browser application, which may provide access to other applications, including the ones discussed herein, located on a remote server as part of a cloud computing service.

The applications 416 may include a calendar application, an email application, a social network application, a weather application, a dashboard or any other type of application. The applications 416 may interact directly with the controller 406 to provide event notifications and/or may interact with controller 406 indirectly through the event manager 418.

In one exemplary implementation, the controller 406 may be configured to inspect or query the event manager 418 and/or the applications 416 to determine when an event has occurred or is going to occur, where it is desirable to charge the battery 402 to full capacity. In another exemplary implementation, the event manager 418 and/or the applications 416 may be configured to notify the controller 406 regarding an event that has occurred or is going to occur, where it is desirable to charge the battery 402 to full capacity. In other implementations, the controller 406 may be configured to query or inspect the event manager 418 and/or the applications 416 in combination with the event manager 418 and/or the applications 416 notifying the controller 406 of events.

In one exemplary implementation, the controller 406 may be configured to charge the battery 402 to capacity based upon an event notification, where the event notification is a scheduled (e.g., user-scheduled) or user-subscribed event. For example, the controller 406 may initially charge the battery 402 to a percentage of full capacity such as 92%. The controller 406 may monitor the application 416 for scheduled events. Additionally, the event manager 418 or one of the applications 416 may notify the controller 406 of a scheduled event. For instance, an offsite meeting that is on a calendar application may trigger the controller 406 to charge the battery 402 to capacity prior the offsite meeting. Similarly, a scheduled airline flight or other trip may trigger the controller 406 to charge the battery 402 to capacity prior to leaving for the airport or prior to the trip. In these examples, the battery 402 may be a battery in an electronic device such as a laptop or a tablet or other electronic device such as those described above. In other examples, the battery 402 may be a battery in an appliance or a vehicle, such as an automobile or a scooter.

In these examples, the event notification may work to notify the controller 406 to charge the battery 402 to capacity well prior to the scheduled event. The event notification may be set to a default period of time or it may be configurable. For example, if an airline flight is scheduled on a calendar application, then the controller 406 may begin charging the battery 402 to capacity a default of 5 hours prior to the scheduled event. Different scheduled events may have different default periods of time. For instance, a scheduled airline trip may cause the controller 406 to charge the battery 402 to full capacity 5 hours before the flight, but a scheduled offsite meeting may cause the controller 406 to charge the battery 402 to capacity 3 hours before the meeting.

Following the user-scheduled event, the controller 406 may charge the battery 402 to a percentage of full capacity that is above a pre-charge capacity and below full capacity. In this manner, the controller 406 may charge the battery 402 to less than full capacity until the controller 406 determines that the battery should be charged to full capacity. After the event, the controller 406 goes back to charging the battery 402 to less than full capacity.

In another exemplary implementation, the scheduled event may not be a user-scheduled event or appointment, but may instead include a scheduled event or an appointment based on a user's group affiliation. For instance, a user's group affiliation may include a religious affiliation, a civic affiliation, a social group affiliation, or any type of group affiliation, where the events may be scheduled by the group and not by the user per se. The user may opt-in to use the group affiliation as an event notification means to trigger the charging of the battery to full capacity prior to such a group-affiliated event.

In another exemplary implementation, the controller 406 may be configured to charge the battery 402 to full capacity based upon an event notification, where the event notification is based on an unscheduled event notification. For instance, unscheduled event notification may include a severe weather notification, an electricity brownout or blackout notification, a civil unrest notification or other type of unscheduled event. The event manager 418 and/or the controller 406 may be configured to monitor for these types of unscheduled events. Also, the user, through the event manager 418 or an application 416, may subscribe to one or more services, which monitor for various types of these unscheduled events and provides notification of these events. Such services may include a weather service, an electricity provider service, an emergency alert service, an aggregated service application or other service.

When the controller 406, either directly or through the event manager 418 or one of the applications 416, receives notification of an unscheduled event, the controller 406 charges the battery 402 to full capacity. In this manner, the user will have a fully charged battery 402 in response to a notification of the unscheduled event.

Following the unscheduled event, the controller 406 may charge the battery 402 to a percentage of full capacity that is below full capacity. In this manner, the controller 406 may charge the battery 402 to less than full capacity until the controller 406 determines that the battery should be charged to full capacity. After the event, the controller 406 goes back to charging the battery 402 to less than full capacity.

In another exemplary implementation, the controller 406 may be configured to charge the battery from less than full capacity to full capacity, based on a history of monitored events. The history of monitored events may include a pattern of user behavior interacting with a device, including interactions with the applications 416. The history of monitored events may include a series of events that occur on a regular or a periodic basis. User interactions with the applications 416 may be stored and tracked in the memory 414. The user may be given control to opt-in and use this feature based on a history of events. The controller 406 may use the history of events to determine when to charge the battery 402 to full capacity. For example, if the system 400 is part of a tablet or electronic reading device, the controller 406 may determine that the user uses the device each night at a certain time to read. The controller 406 may charge the battery 402 to full capacity prior to that time each night. At other times, the controller 406 would charge the battery 402 to less than full capacity.

The system 400 also may include one or more sensors 420. The sensors 420 may include a global positioning system (GPS) sensor, which may be configured to track and indicate a location of the system. The controller 406 may work in conjunction with the sensors 420 to determine when a sensor event occurs. Upon occurrence of a sensor event, the controller 406 may charge the battery 402 to a second percentage of full capacity, where the second percentage of full capacity is higher than the first percentage of full capacity.

The sensors 420 may include a position-related sensor that may use position-related data to determine a position of the system. Any data indicative of position may be used. For example, position-related data may include a history of wi-fi locations, known cellular position, known position of wireless access points, image-related position data and other position-related data.

In some implementations, the controller 406 charges the battery 402 to full capacity. In the example where the sensors 402 include a position-related sensor including for instance a GPS sensor, the controller 406 may monitor the position-related sensor to determine if the position-related sensor detects that the system 400 is at or beyond a predetermined location. For instance, the position-related sensor may be configured to detect when the system leaves a certain geographic location such as the office or the home. Upon detection that the system is outside of a predetermined location, the controller 406 may charge the battery 402 to a higher percentage of full capacity or to full capacity at the next recharging opportunity. Other sensors may include a temperature sensor, a radio frequency identification (RFID) sensor, and other sensors.

In one exemplary implementation, the system 400 may include a user interface 422, which is operably coupled to the controller 406. The user interface 422 may include an application which allows the user to set, change and/or control one or more settings related to managing the battery charging process. For example, the user interface 422 may allow the user to set one or more event notifications. The user interface 422 also may present the user with options to choose between keeping the battery 402 at full capacity or keeping the battery 402 at less than full capacity until an event notification occurs at which time the controller 406 charges the battery 402 to full capacity. In this manner, the user is given the option to maintain the battery at less than full capacity, where this option may lengthen the life of the battery and may provide a more constant apparent capacity to the user over the life of the battery 402. The charging circuit 404 may include one or more pins 410 and 412. Communications between the charging circuit 404 and the controller 406 is necessary. The pins 410 and 412 may provide coupling points between the charging circuit 404 and the controller 406.

Figure 5:
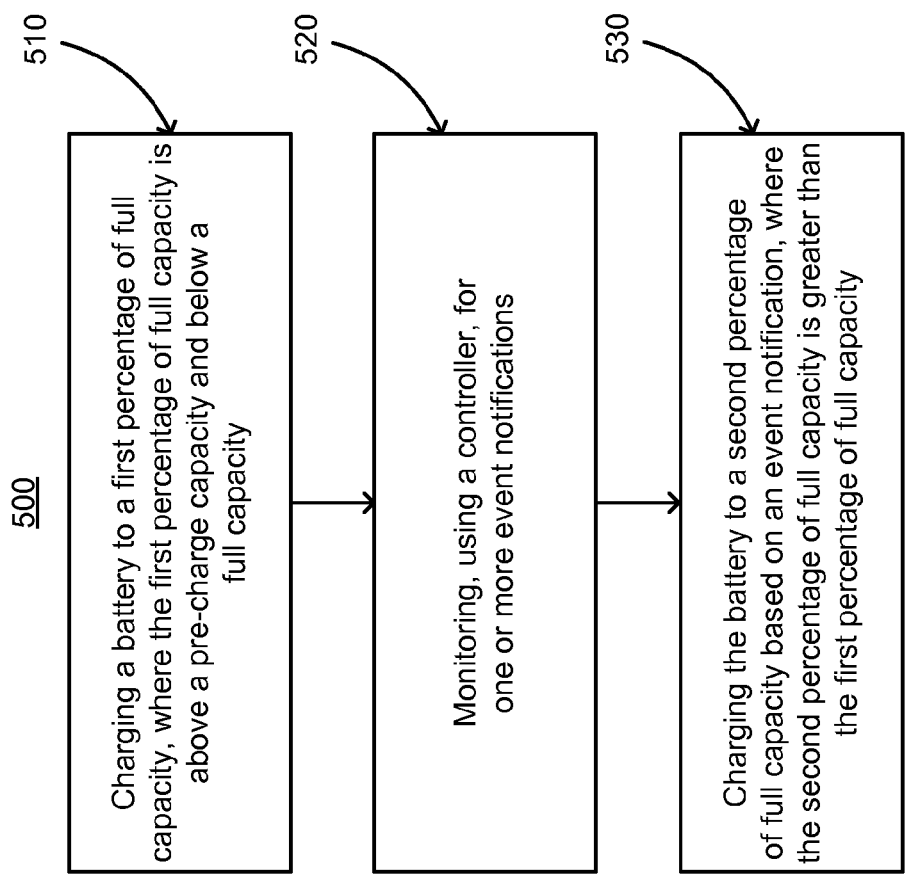
FIG. 5 is a flow diagram of an exemplary process for implementing the system of FIG. 4.

Referring to FIG. 5, an exemplary flow diagram illustrates a process 500. Process 500 may include charging the battery to a first percentage of full capacity, where the first percentage of full capacity is above a pre-charge capacity and below a full capacity (510). For example, the controller 406 may be configured to charge the battery 402 to a first percentage of full capacity of 92%. Process 500 also includes monitoring, using a controller, for one or more event notifications (520). For example, as discussed above, the controller 406 in cooperation with the applications 416 and/or the event manager 418, may monitor for one or more event notifications. As discussed above, event notifications may include scheduled events (e.g., by the user or otherwise) and/or unscheduled events (e.g., severe weather events, electrical power-related event).

Based on the event notification, the battery may be charged to a second percentage of capacity, where the second percentage of full capacity is greater than the first percentage of full capacity (530). For example, when the controller 406 determines that a specific event notification has occurred (e.g., a scheduled event or an unscheduled event), the controller 406 may charge the battery 402 to full capacity. In this manner, the battery 402 may exhibit a constant apparent capacity over the service life of the battery and the battery 402 may have a longer service life. Also, in this manner, the battery 402 is fully charged prior to the event.

The monitoring for one or more events notifications (520) also may include monitoring one or more sensors for a sensor event. For example, as discussed above, the controller 406 may monitor one or more sensors 420 for a sensor event. Charging the battery to a second percentage of full capacity (530) also may include charging the battery to a second percentage of full capacity based on a sensor event. For example, the sensors 420 may include a position-related sensor such as, for example, a GPS sensor. The controller 406 may monitor the GPS sensor and if the GPS sensor indicates that it is located at or beyond a predetermined location, then the controller 406 may charge the battery 402 to full capacity.

Figure 6:
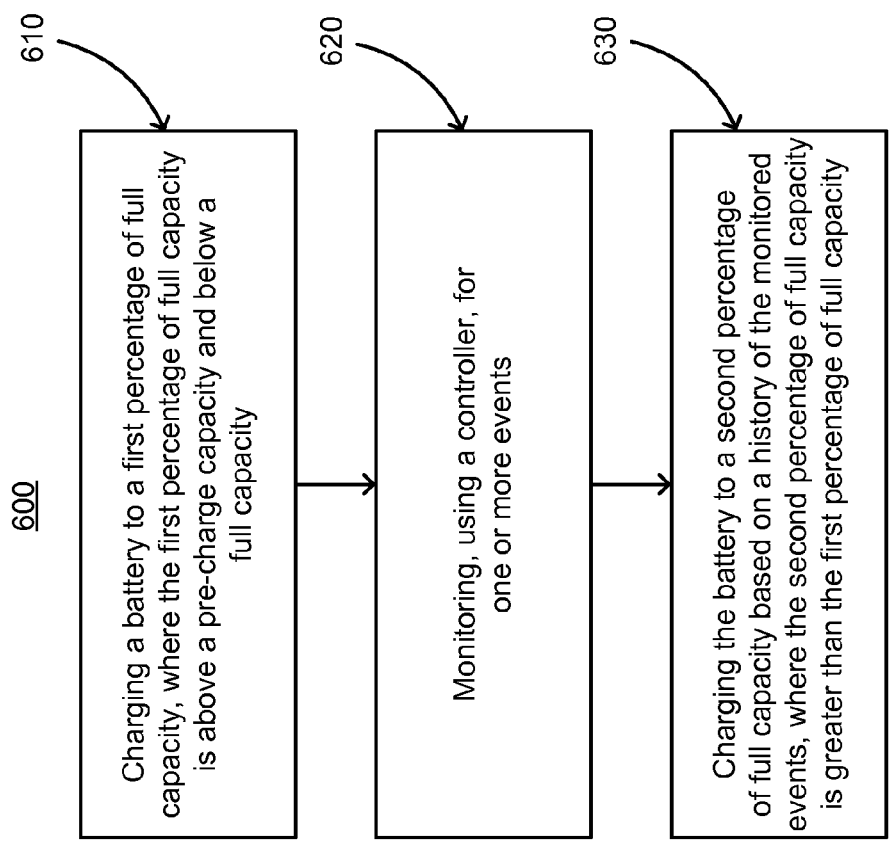
FIG. 6 is a flow diagram of an exemplary process for implementing the system of FIG. 4.

Referring to FIG. 6, an exemplary flow diagram illustrates a process 600. Process 600 may include charging the battery to a first percentage of full capacity, where the first percentage of full capacity is above a pre-charge capacity and below a full capacity (610). For example, the controller 406 may be configured to charge the battery 402 to a first percentage of full capacity of 92%. Process 600 also includes monitoring, using a controller, for one or more events (620). For example, as discussed above, the controller 406 in cooperation with the applications 416 and the event manager 418, may monitor for one or more events. The controller 406 may store a history of events in the memory 414 and may analyze the stored history of events for a related series of events or patterns of events. The history of events may be related to user interaction or behavior with a device in which the battery 402 is used. For example, the user may use an electronic reading application each night at the same time. Additionally, the user may perform other tasks or use a device in which the rechargeable battery is used in a regular pattern.

Based on the history of the monitored events, the battery may be charged to a second percentage of capacity, where the second percentage of capacity is greater than the first percentage of capacity (630). For example, when the controller 406 determines that a particular events occurs at a regular time based on a history of monitored events, the controller 406 may charge the battery 402 to full capacity in anticipation of the regular event. In this manner, the battery 402 may exhibit a constant apparent capacity over the service life of the battery and the battery 402 may have a longer service life. Also, in this manner the battery 402 is fully charged prior to the regularly occurring event. At other times, the controller 406 may charge the battery 402 to less than full capacity.

Figure 7:
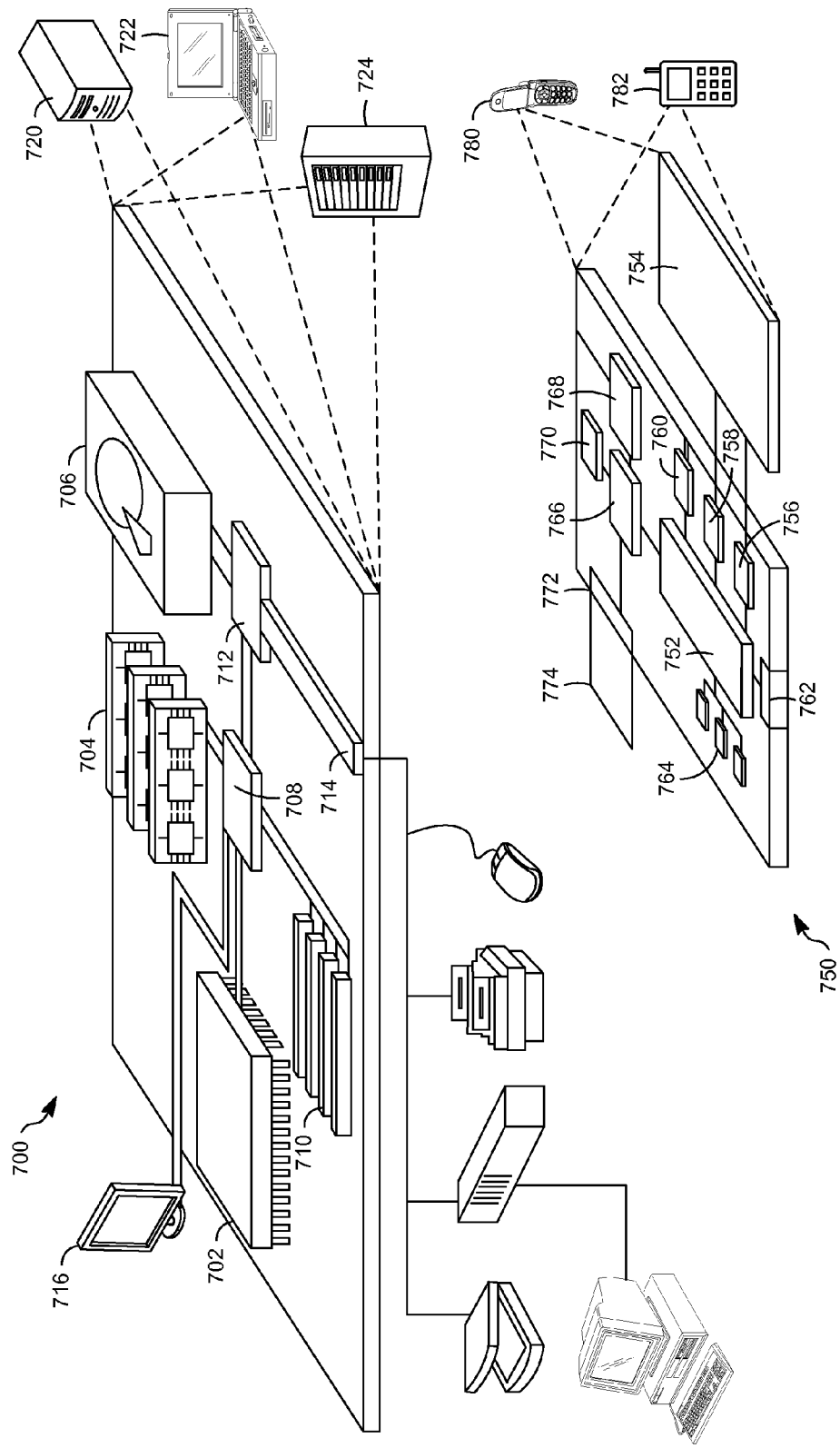
FIG. 7 shows an example of a computer device and a mobile computer device that can be used to implement the techniques described here.

FIG. 7 shows an example of a generic computer device 700 and a generic mobile computer device 750, which may be used with the techniques described here. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. The computer program product may also contain instructions that, when executed, perform one or more methods, such as those described above. The information carrier is a non-transitory computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, or memory on processor 752, that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smart phone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
   charging a battery to a first percentage of full capacity, wherein the first percentage of full capacity is above a pre-charge capacity and below the full capacity;
   monitoring, using a controller, the battery for a predetermined threshold, wherein the predetermined threshold comprises a combination of two or more criteria selected from the group consisting of a number of charge cycles, a load history metric, a period of time and a temperature based on a temperature history; and
   in response to the battery reaching the predetermined threshold, charging the battery to a second percentage of full capacity, wherein the second percentage of full capacity is greater than the first percentage of full capacity.

2. The method as in claim 1 wherein the battery comprises a lithium ion battery.

3. The method as in claim 1 wherein charging the battery to the first percentage of full capacity and charging the battery to the second percentage of full capacity occur during different charging cycles.

4. The method as in claim 1 wherein the second percentage of full capacity is substantially equal to the full capacity of the battery.

5. The method as in claim 1 further comprising charging the battery to an intermediate percentage of full capacity, wherein the intermediate percentage of full capacity is between the first percentage of full capacity and the second percentage of full capacity.

6. An apparatus, comprising:
   a charging circuit that is arranged and configured to charge a battery; and
   a controller that is operably coupled to the charging circuit, the controller being arranged and configured to:
   charge the battery to a first percentage of full capacity, wherein the first percentage of full capacity is above a pre-charge capacity and below the full capacity;
   monitor the battery to determine when a predetermined threshold is reached, wherein the predetermined threshold comprises a combination of two or more criteria selected from the group consisting of a number of charge cycles, a load history metric, a period of time and a temperature based on a temperature history; and
   in response to the battery reaching the predetermined threshold, charge the battery to a second percentage of full capacity, wherein the second percentage of full capacity is greater than the first percentage of full capacity.

7. The apparatus of claim 6 wherein the battery comprises a lithium ion battery.

8. The apparatus of claim 6 wherein the controller is arranged and configured to charge the battery to the first percentage of full capacity and charge the battery to the second percentage of full capacity during different charging cycles.

9. The apparatus of claim 6 wherein the second percentage of full capacity is substantially equal to the full capacity of the battery.

10. The apparatus of claim 6 wherein the controller is arranged and configured to charge the battery to an intermediate percentage of full capacity, wherein the intermediate percentage of full capacity is between the first percentage of full capacity and the second percentage of full capacity.

11. A method comprising:
    charging a battery to a first percentage of full capacity, wherein the first percentage of full capacity is above a pre-charge capacity and below the full capacity;
    monitoring, using a controller, the battery for a predetermined threshold, wherein the predetermined threshold comprises a combination of two or more criteria selected from the group consisting of a number of charge cycles, a load history metric, a period of time and a temperature based on a temperature history;
    measuring, using the controller, a capacity of the battery; and
    charging the battery to a second percentage of full capacity based on a combination of the measured capacity of the battery and the battery reaching the predetermined threshold, wherein the second percentage of full capacity is greater than the first percentage of full capacity.

12. The method as in claim 11 wherein the battery comprises a lithium ion battery.

13. The method as in claim 11 wherein charging the battery to the first percentage of full capacity and charging the battery to the second percentage of full capacity occur during different charging cycles.

14. The method as in claim 11 wherein the second percentage of full capacity is substantially equal to the full capacity of the battery.

15. An apparatus, comprising:
    a charging circuit that is arranged and configured to charge a battery; and
    a controller that is operably coupled to the charging circuit, the controller being arranged and configured to:
    charge the battery to a first percentage of full capacity, wherein the first percentage of full capacity is above a pre-charge capacity and below a full capacity;
    monitor the battery for a predetermined threshold, wherein the predetermined threshold comprises a combination of two or more criteria selected from the group consisting of a number of charge cycles, a load history metric, a period of time and a temperature based on a temperature history;
    measure a capacity of the battery; and charge the battery to a second percentage of full capacity based on a combination of the measured capacity of the battery and the battery reaching the predetermined threshold, wherein the second percentage of full capacity is greater than the first percentage of full capacity.

16. The apparatus of claim 15 wherein the battery comprises a lithium ion battery.

17. The apparatus of claim 15 wherein the controller is configured to charge the battery to the first percentage of full capacity and charge the battery to the second percentage of full capacity during different charging cycles.

18. The apparatus of claim 15 wherein the second percentage of full capacity is substantially equal to the full capacity of the battery.

* * * * *